United States Patent
MacNally (10) Patent No.: US 6,516,185 B1
(45) Date of Patent: Feb. 4, 2003

(54) AUTOMATIC GAIN CONTROL AND OFFSET CORRECTION

(75) Inventor: Donald E. MacNally, San Francisco, CA (US)

(73) Assignee: Level One Communications, Inc., Sacramento, CA (US)

( * ) Notice: Subject to any disclaimer, the term of this patent is extended or adjusted under 35 U.S.C. 154(b) by 0 days.

(21) Appl. No.: 09/577,904

(22) Filed: May 24, 2000

Related U.S. Application Data (60) Provisional application No. 60/135,480, filed on May 24, 1999.

(51) Int. Cl.[7] .................................................. H04B 1/06
(52) U.S. Cl. ..................... 455/234.1; 455/324; 375/345
(58) Field of Search .............................. 455/63, 196.1, 455/234.1, 296, 303, 304, 306, 310, 324, 334, 335; 375/345

(56) References Cited

U.S. PATENT DOCUMENTS

| | | | |
|---|---|---|---|
| 5,095,533 A | | 3/1992 | Loper et al. |
| 5,241,702 A | * | 8/1993 | Dent .......................... 455/278.1 |
| 5,249,203 A | * | 9/1993 | Loper ............................ 375/97 |
| 5,568,520 A | * | 10/1996 | Lindquist et al. ............ 375/344 |
| 5,838,735 A | | 11/1998 | Khullar |
| 6,009,126 A | * | 12/1999 | Van Bezooijen ............. 375/319 |
| 6,031,878 A | * | 2/2000 | Tomasz et al. .............. 375/316 |
| 6,038,268 A | * | 3/2000 | Kawai ......................... 375/334 |
| 6,192,225 B1 | * | 2/2001 | Arpala et al. ............. 455/196.1 |
| 6,246,728 B1 | * | 6/2001 | Vogel et al. ................. 375/322 |
| 6,370,205 B1 | * | 4/2002 | Lindoff et al. .............. 375/319 |

* cited by examiner

Primary Examiner—Thanh Cong Le
Assistant Examiner—James Ewart
(74) Attorney, Agent, or Firm—Merchant & Gould P.C.

(57) ABSTRACT

A direct conversion type transceiver system incorporates an offset correction and automatic gain control system. The automatic gain control system includes an amplifier amplifying a baseband signal which is directly converted from a received incoming RF signal, a feedback offset canceller controllably canceling DC offset, an automatic gain controller controlling gain of the amplifier, and a feed forward offset canceller coupled to a signal peak detector. The signal peak detector controlling the automatic gain controller and the feed forward offset canceller simultaneously, the feed forward offset canceller further canceling the DC offset.

13 Claims, 6 Drawing Sheets

AUTOMATIC GAIN CONTROL AND OFFSET CORRECTION

RELATED APPLICATION

This application claims the benefit of Provisional Application, U.S. Ser. No. 60/135,480, filed on May 24, 1999, entitled "AUTOMATIC GAIN CONTROL AND OFFSET CORRECTION", by Donald E. MacNally.

BACKGROUND OF THE INVENTION

1. Field of the Invention

This invention relates in general to a direct conversion type transceiver in a communication system, and more particularly to an automatic gain control and offset correction technique used in a direct conversion type transceiver in a communication system.

2. Description of Related Art

Today's wireless communications markets are being driven by a multitude of user benefits. Products such as cellular phones, cordless phones, pagers, and the like have freed corporate and individual users from their desks and homes and are driving the demand for additional equipment and systems to increase their utility. As a result digital radio personal communications devices will play an increasingly important role in the overall communications infrastructure in the next decade.

Mixed-signal integration and power management have taken on added importance now that analog and mixed analog-digital ICs have become the fastest-growing segment of the semiconductor industry. Integration strategies for multimedia consoles, cellular telephones and battery-powered portables are being developed, as well as applications for less integrated but highly specialized building blocks that serve multiple markets. These building blocks include data converters, demodulators, filters, amplifiers and voltage regulators.

One aspect of digital radio personal communications devices is the integration of the RF sections of transceivers. Compared to other types of integrated circuits, the level of integration in the RF sections of transceivers is still relatively low. Considerations of power dissipation, form factor, and cost dictate that the RF/IF portions of these devices evolve to higher levels of integration than is true at present. Nevertheless, there are some key barriers to realizing these higher levels of integration.

For example, in a time division duplex (TDD) frequency shift keying (FSK) transceiver, a direct conversion type of receiver architecture is often desired. The receiver accepts an incoming RF signal as RF positive (RF+) and RF negative (RF−), amplifies the signal with a low noise amplifier (LNA), and then directly converts the signal to a baseband frequency range. Channel select filters are typically used to select the desired channel that exits at frequencies, e.g. from 0 Hz (DC) to 800 KHz. Once the signal is filtered, the signal must be amplified and presented to a demodulator of the receiver for data recovery.

However, for information to be correctly received from the RF signal, the signal must be down-converted and amplified to a predetermined level, i.e. the signal paths must have a proper gain to present the signals to the demodulator. Such amplification results in a large amount of DC gain within the baseband. The large amount of DC gain acts upon small DC offsets within the various receiver components producing large DC offsets that destroy the desired signal.

In addition to the receiver having to deal with a large DC offset problem and simultaneous gain control, the constraint that the offset and gain loops must settle within a preamble period of the incoming signal, e.g. 32 bits or 320 uS, also exists.

Therefore, there is a need for incorporating an offset correction and automatic gain control system into a direct conversion type of transceiver in a communication system. Further, there is a need for an offset correction and automatic gain control system which is capable of controlling the offset and gain loops within a preamble period of the incoming signal.

It is with respect to these and other considerations that the present invention has been made.

SUMMARY OF THE INVENTION

To overcome the limitations in the prior art described above, and to overcome other limitations that will become apparent upon reading and understanding the present specification, the present invention discloses an offset correction and automatic gain control system in a direct conversion type of transceiver in a communication system.

The present invention solves the above-described problems by canceling the DC offset and controlling the gain of the amplified signal within a preamble period of an incoming signal, whereby the incoming signal is first temporarily high pass filtered by means of a "feedback offset integrator," and second, all pass filtered by means of holding the offset integrator within the "feedback offset integrator," and third, peak detected over a certain time frame to determine its envelop. Note that the time frame of the envelop in conjunction with the signal format guarantees a positive peak and a negative peak to occur during the event of the "envelop detection". The DC content of the incoming signal envelop is subtracted from the instantaneous incoming signal that contains a fixed DC offset, thereby resulting in the incoming signal without the fixed DC offset. The instantaneous incoming signal retains its necessary DC content while the undesired DC offset is cancelled.

The method in accordance with the principles of the present invention includes receiving the incoming RF signal; converting the RF signal to a baseband signal; amplifying the baseband signal; and canceling the DC offset and controlling the gain of the amplified baseband signal within a preamble period of the incoming signal, wherein the incoming baseband signal is peak detected over a certain time frame to determine its envelop. The DC content of the incoming baseband signal envelop is then subtracted from the instantaneous incoming baseband signal plus DC offset thereby resulting in the incoming baseband signal without DC offset. The instantaneous incoming baseband signal retains its necessary DC content while the undesired offset is cancelled.

Also, the present invention provides an offset correction and automatic gain control system. In one embodiment, the offset correction and automatic gain control system includes a feedback offset integrator which corrects the DC offset in a coarse fashion. The offset integrator is controlled by a timing mechanism during a preamble period of the incoming signal. A signal peak detector is used to determine the signal envelop. The envelop is used to further reduce the residual coarse fixed DC offset by means of a feed forward offset cancellation technique. In addition, the peak detector determined envelop is used to control the gain of various signal amplifiers and filters within the system.

Other embodiments of a system in accordance with the principles of the invention may include alternative or optional additional aspects. One such aspect of the present invention is that the incoming signal is filtered to eliminate undesirable signals.

Another aspect of the present invention is that the direct conversion of the incoming RF signal includes converting the incoming RF signal to baseband in-phase (I) and quadrature (Q) signals. In one embodiment, the converted I and Q signals are differential input signals.

The present invention also provides for a direct conversion type transceiver system in a communication system. In one embodiment, the transceiver system includes: an antenna receiving an incoming RF signal; a low noise amplifier, coupled to the antenna, amplifying the signal; and an offset correction and automatic gain control system for correcting the DC offset and controlling the gain of the signal. The offset correction and automatic gain control system includes a feedback offset integrator which corrects the DC offset in a coarse fashion. The offset integrator is controlled by a timing mechanism during a preamble period of the incoming signal. A signal peak detector is used to determine the signal envelope. The envelop is used to further reduce the residual coarse fixed DC offset by means of a feed forward offset cancellation technique. In addition, the peak detector determined envelop is used to control the gain of various signal amplifiers and filters within the system.

These and various other advantages and features of novelty which characterize the invention are pointed out with particularity in the claims annexed hereto and form a part hereof. However, for a better understanding of the invention, its advantages, and the objects obtained by its use, reference should be made to the drawings which form a further part hereof, and to accompanying descriptive matter, in which there are illustrated and described specific examples of an apparatus in accordance with the invention.

BRIEF DESCRIPTION OF THE DRAWINGS

Referring now to the drawings in which like reference numbers represent corresponding parts throughout.

DETAILED DESCRIPTION

In the following description of the exemplary embodiment, reference is made to the accompanying drawings which form a part hereof, and in which is shown by way of illustration the specific embodiment in which the invention may be practiced. It is to be understood that other embodiments may be utilized as structural changes may be made without departing from the scope of the present invention.

The present invention discloses an automatic gain control and offset correction system and method in a direct conversion type of transceiver in a communication system. The automatic gain control and offset correction system and method cancels the DC offset and controls the gain of the amplified signal within a preamble period of an incoming signal, whereby the incoming signal is first temporarily high pass filtered by means of a "feedback offset integrator," and second, all pass filtered by means of holding the offset integrator within the "feedback offset integrator," and third, peak detected over a certain time frame to determine its envelop. Note that the time frame of the envelop in conjunction with the signal format guarantees a positive peak and negative peak to occur during the event of the "envelop detection". The DC content of the incoming signal envelop is subtracted from the instantaneous incoming signal that contains a fixed DC offset resulting in the incoming signal without the fixed DC offset. The instantaneous incoming signal retains its necessary DC content while the undesired DC offset is cancelled.

Figure 1:
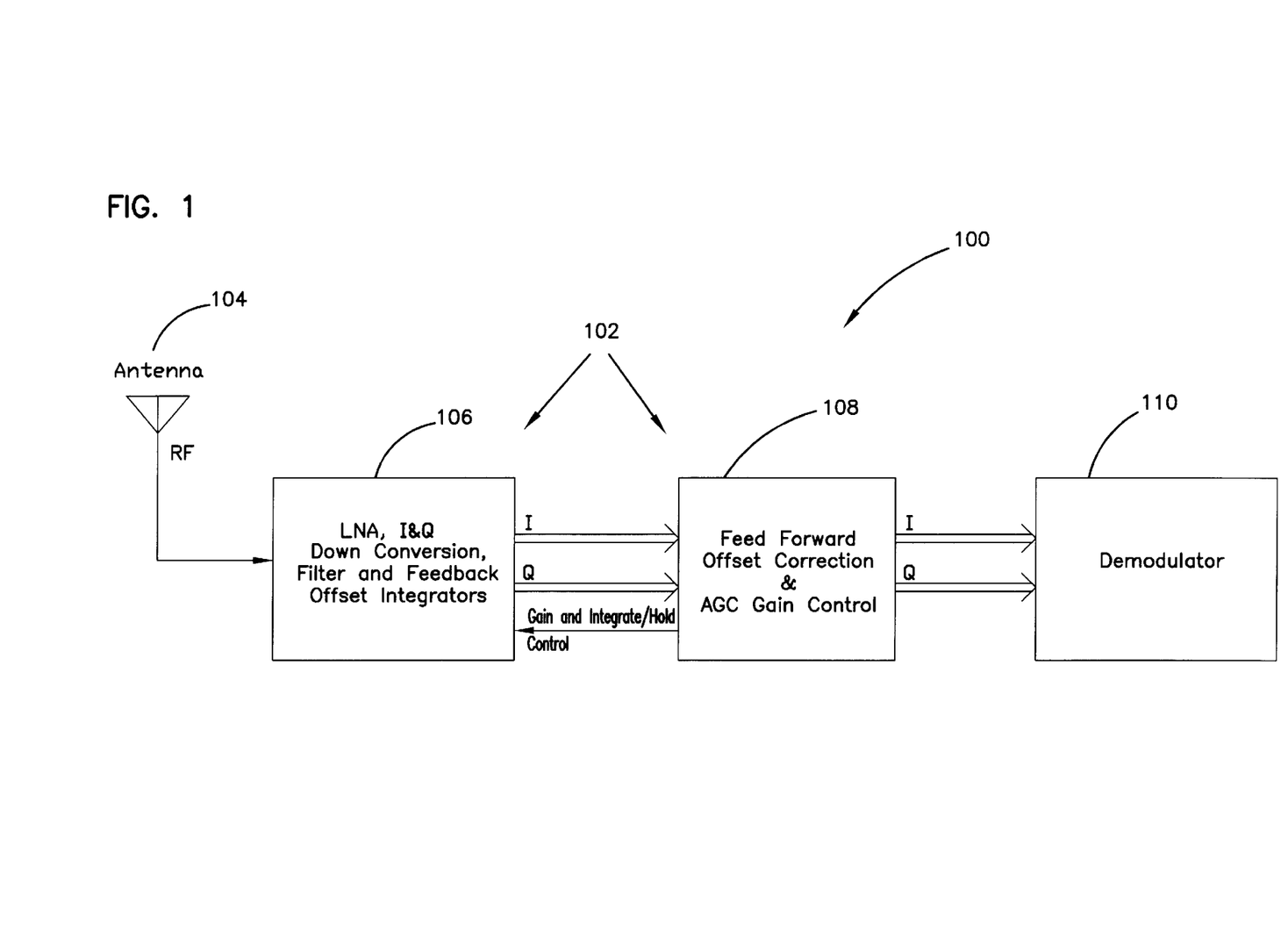
FIG. 1 illustrates a block diagram showing one embodiment of a direct conversion transceiver system having an automatic gain control and offset correction system in accordance with the principles of the present invention.

FIG. 1 illustrates one embodiment of a direct conversion transceiver 100 having an automatic gain control and offset correction system 102 in accordance with the principles of the present invention. In FIG. 1, an incoming RF signal is received at an antenna 104 and routed into the transceiver 100. A low noise amplifier (LNA), I&Q down converter, filter 106, amplifies the signal, and directly converts the signal to a baseband frequency range, e.g. from 0 to 24 MHz. Channel select filters are used to select the desired channel which exits at frequencies from e.g. 0 to 750 KHz. As shown, the signal is amplified, converted to a baseband in-phase (I) signal and a baseband quadrature (Q) signal, and filtered into an I-channel and a Q-channel. The signal may also be converted to a differential signal in an I-channel and a differential signal in a Q-channel, respectively. Also, as shown in block 106, the channel select filters incorporate feedback offset integrators for coarse offset correction.

The signals are then sent to a fine feed forward offset cancellation and automatic gain control system 108 to cancel their residual DC offset and adjust their gain before they are sent to a subsequent circuit, such as a demodulator 110, for data recovery. The system 108 also controls the coarse offset correction by sending gain and integrator/hold control signal to the feedback offset integrators in block 106.

Figure 2:
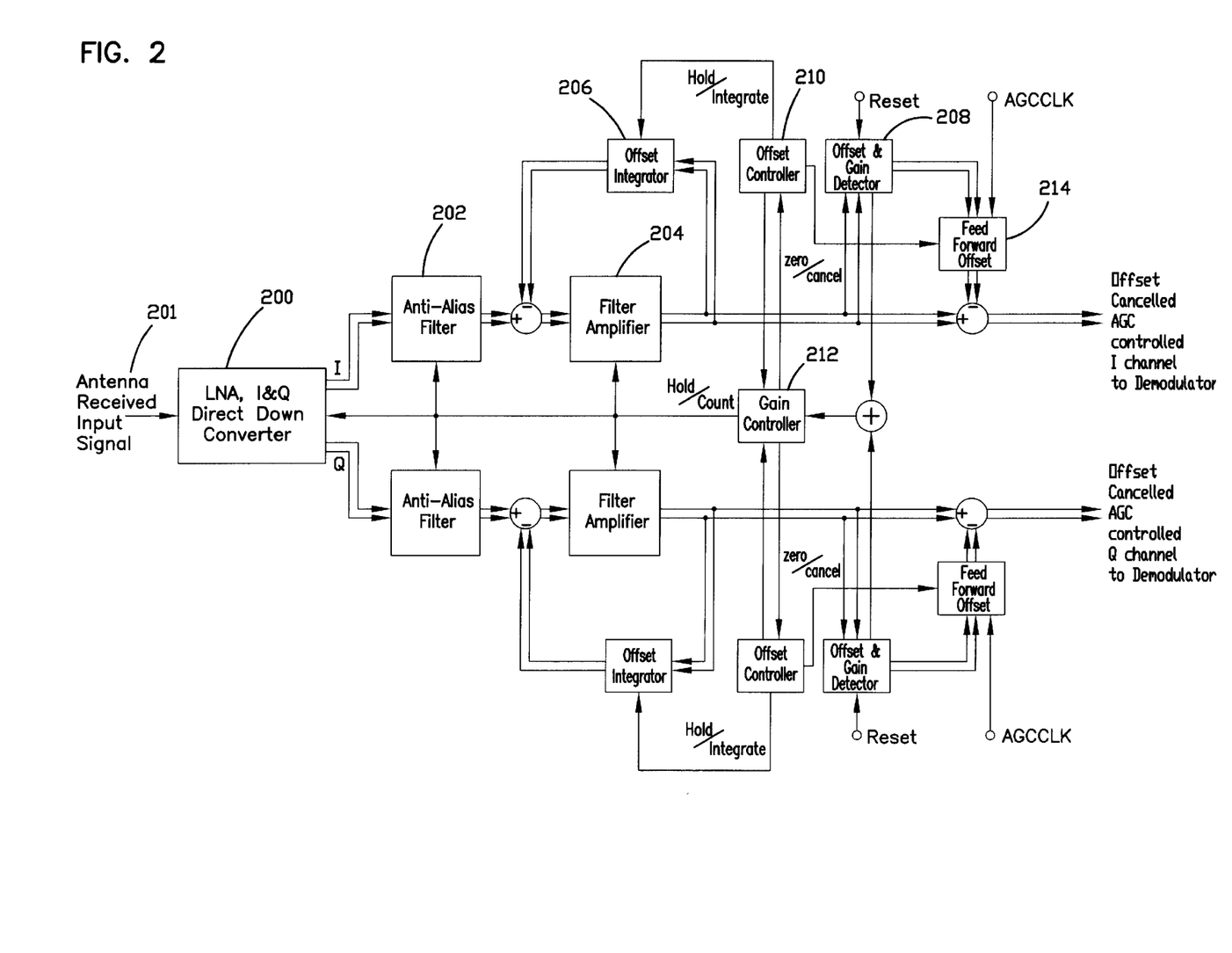
FIG. 2 illustrates a block diagram of one embodiment of the automatic gain control and offset correction system in accordance with the principles of the present invention.
Figure 3:
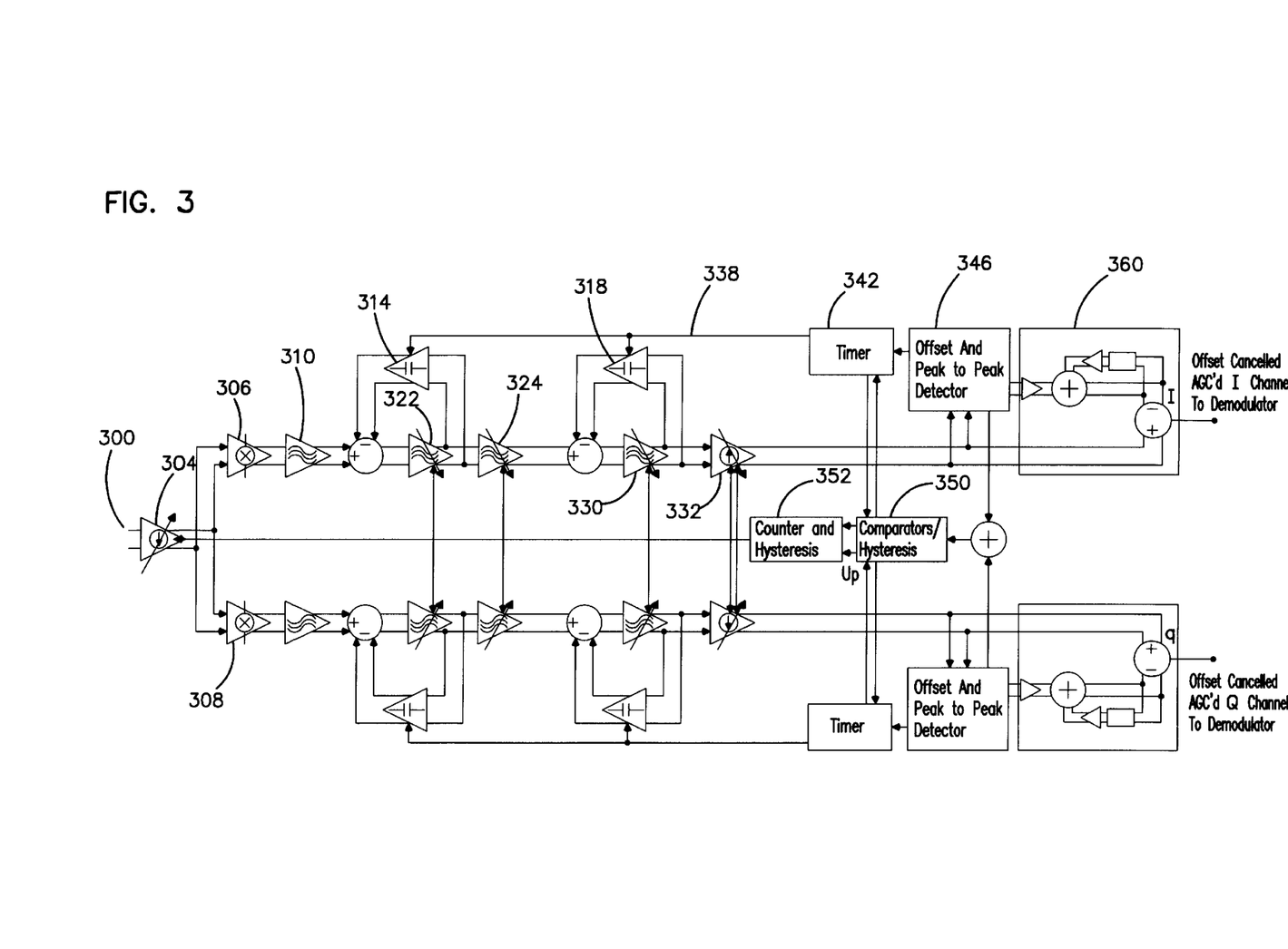
FIG. 3 illustrates in greater detail a block diagram of one embodiment of the automatic gain control and offset correction system in accordance with the principles of the present invention.

As shown in FIGS. 2 and 3, a received signal 201 and 300 enters the transceiver at the low noise amplifier (LNA) 200, 304. In a preferred embodiment, the LNA gain has two gain settings. One has a voltage gain of 1, and the other one has a voltage gain of 10. The signal is then split into two versions and applied to the I and Q receiver mixers (200 in FIG. 2, 306, 308 in FIG. 3). The conversion voltage gain of each of the mixers is preferably 3. The mixers use in-phase and quadrature local oscillators (LOs) at the received RF signal's center frequency to down convert the RF signal into two independent baseband in phase (I) and quadrature (Q) signals. Hence, the name given to this type of transceiver architecture is a "direct conversion" transceiver architecture. A complex RF signal may be represented by two baseband signals, i.e. I and Q baseband signals.

The I and Q mixers have three sources for DC offset. The three sources can be referenced to the mixer output. The first source is due to physical mismatching of the transistors within the mixers. The second source has to do with the mismatching of the transistors within the local oscillators. The third source is due to the local oscillators leaking outside the RF integrated circuit and back in through an antenna port and mixing the leaking signal with the incoming signal inside of the mixers.

The first two sources produce relatively fixed offsets, while the third can vary with the position of the antenna relative to the leaky RF field of the LOs. To minimize the third source of DC offset, all RF and baseband signals are of a differential voltage format. In addition the I and Q local oscillator signals are also of a differential voltage format. Differential local oscillator signals help minimize radiation while differential desired signals help reduce their susceptibility to local oscillator leakage. It is appreciated that the conversion from a single ended signal to differential signals, and vise versa, can be achieved in a conventional means and is generally known to a person skilled in the art.

In FIGS. 2 and 3, since the I signal path and the Q signal path are generally in a mirror image, only the I signal path is described in detail.

An anti-alias filter (AAF) 202, 310 is coupled to the I&Q direct down conversion 200, 306, respectively. The I and Q signals are passed on to the AAF which has a preferably voltage gain of 6. The AAF is used to attenuate the signal at frequencies which would otherwise pass directly through a time sampled switched capacitor filter (SCF)/amplifier 204, 322.

Alternatively, a series of SCFs are used to filter and amplify the converted signal. As shown in FIG. 3, the series of filters/amplifiers are preferably three adjustable gain switched capacitor filter (SCF) amplifiers and a last stage gain amplifier. Thus, the signal is passed on to three sections of switched capacitor channel filtering, each with a preferably adjustable gain of 1 or 4, and a last stage gain amplifier with a preferably adjustable gain of 1, 2, 4. The three sections of switched capacitor channel filtering may be comprised of two sections of filtering and one section of group delay equalization (GDE). The GDE may be placed at the last stage of the filter chain. In one implementation, the adjustable gain arrangement of the baseband filters plus extra stage of gain provides for a gain in steps of powers of 2 from 1 to 256.

In FIGS. 2 and 3, an offset integrator 206, 314, 318 is coupled to the filter/amplifier 204, 322, 330 in a feedback loop, i.e. a feedback offset integrator. The offset integrator 206, 318 is used to cancel the accumulated DC offset voltage at two locations within the receive chain. In the example shown in FIG. 3, the two offset integrators 314 and 318 are placed a feedback loop around a $1^{st}$ switched capacitor filter (SCF) 322 and a group delay equalizer (GDE) 330, i.e. the $1^{st}$ and $3^{rd}$ place in the series of filters/amplifiers 322, 324, 330, and 332, i.e. the filter/amplifier 204 in FIG. 2. The feedback loops act as high pass filters with cutoff frequencies of, for example, 25 KHz. In addition, the offset integrators 314, 318 can be made to hold an offset voltage at which they settle. In operation, the offset integrators cancel out the DC offset within a preamble time period of the incoming signal and then hold the offset voltage for a period of time, such as 2 mS, for the remaining length of the data burst of the incoming signal. A hold mode is performed because the high pass function, for example a 25 KHz high pass function, produces too much DC wander for a given receive signal format.

In FIGS. 2 and 3, the amplified and offset corrected signal is then passed on to a signal peak detector 208, 346 for determination of a signal level and an offset. The automatic gain control and feed forward offset cancellation loop, described further on, may both use the same peak detector and sample the signal at the output of the last adjustable gain stage. The signal level calculated as: Vp–p=PosPeak–NegPeak, while the offset voltage is calculated as: Voffset=(PosPeak+NegPeak)/2. It is noted that the peak detectors obtain the positive and negative peaks over a period of time, e.g. a 10 uS time period. At the end of each 10 uS time period, the signal amplitude and offset is calculated. The peak detectors are then reset and will obtain the amplitude and offset information over the next 10 uS time period.

As shown in FIGS. 2 and 3, the offset integrators 206, 314, 318 are preferably controlled by an offset controller 210, for example, a timer 342, during a portion of the signal preamble. It is appreciated that other control means can be implemented within the scope and spirit of the present invention. For example, comparators and hysteresis can be used to control the offset integrators.

In FIGS. 2 and 3, the gains of the filters/amplifiers 204, 322, 324, 330, and 332, as well as the LNA 200, 304, are controlled by an automatic gain controller 212, 350, 352. The automatic gain controller includes a gain control window comparator/hysteresis 350 and a counter/hysteresis 352. The signal levels from the peak detectors of the I channel and Q channel are summed and input into the gain control window comparator/hysteresis 350. A signal amplitude window comparator 212 and 350 is used to determine if the amplitude, as calculated from the peak detectors, is within certain limits. At the start of a data burst of an incoming signal, the automatic gain controller (AGC) is allowed to increase, decrease or do nothing to the gain of the LNA and the baseband amplifiers. The AGC is allowed to be updated as long as the signal amplitude is outside the range of the inner window, for example 300 mV to 800 mV. As soon as the amplitude goes within the range of the inner window, the window increases its size, for example to 150 mV to 1.6 V. When the amplitude window is increased, the AGC is inhibited from making gain changes to the LNA and baseband amplifiers. If the amplitude of the baseband signals ever goes outside the increased window limits, then the window reverts back to the inner window limits, and the LNA and baseband gain are allowed to be altered by the AGC again. This action is referred to as "hysterisis" and is used so that small fluctuations in signal amplitude do not erroneously trigger the commencement of gain updates. Accordingly, the signal level of the signal is regulated to move within a range, an outer range, for example, 0.15 to 1.6 Vp–p. The gain is controlled via the counter 352, e.g. an up/down counter which increments or decrements the gain in predetermined steps, such as 6 dB steps. At the start of a data burst, the gain is allowed to increase/decrease until the (Vp–p(I)+Vp–p (Q))/2) signal level is within a range, an inner range, for example, 0.3 to 0.8 volts, at an 8 dB window. At this point, the gain is held, i.e., the up/down counter 352 is disabled, and the gain control window is regulated to move outward to the outer range, e.g. 0.15 to 1.6 volts. As is the case for the offset control, the gain control allows the gain to adjust if the peak to peak signal level goes outside the outer range of the signal level.

Also as shown in FIGS. 2 and 3, the regulated signal is then passed on to a feed forward automatic offset cancellation loop 214, 360. Additional DC offset cancellation may be needed as the signal level can be as small as 0.15 volts, while the offset can be as great as 0.4 volts. The offset integrators 314, 318 may not bring the offset down low enough to obviate the use of the feed forward offset cancellation loop due to their wide high pass bandwidth, e.g. 25 KHz. The feed forward offset cancellation loop is capable of bringing the offset down to +/-2 mv. This level of offset can be handled by the demodulator.

The feed forward offset cancellation loop has the benefit of using the offset as derived from the peak detector, which does not contain a significant signal induced DC wander. Simulations have shown that the feed forward equivalent high pass bandwidth can be 10 times wider than the offset integrator bandwidth for the same amount of signal induced DC wander. In an example, the feed forward offset high pass bandwidth may be 5 KHz and can continuously run during the entire receive data burst. The feed forward offset cancellation loop may run fast enough to follow an integrator leakage and a LO induced offset drift throughout the data burst.

Also, as shown in FIG. 2, the peak detector may be reset and then allowed to obtain the signal level and offset over the next predetermined time period. Once the signal level and offset are obtained, the automatic gain controller is updated and causes transients within the amplifier chain. The transients are let to die out over a time frame, e.g. 3 uS, before the peak detectors are reset for the following time frame, e.g. 7 uS. This provides for accurate determination of DC offset voltage and signal amplitude every time frame, e.g. 10 uS.

It is appreciated that alternative embodiments may be used to implement the present invention. For example, certain gain arrangements may obviate the need for two feedback offset integrators or any feedback offset integrators. The general principal of envelope detection for gain and fine feed forward offset cancellation still applies. It is noted that the use of envelope detection separates the signal induced DC wander from the component induced DC offset thereby allowing for continuous offset cancellation while not causing additional signal dependant wander.

Figure 4:
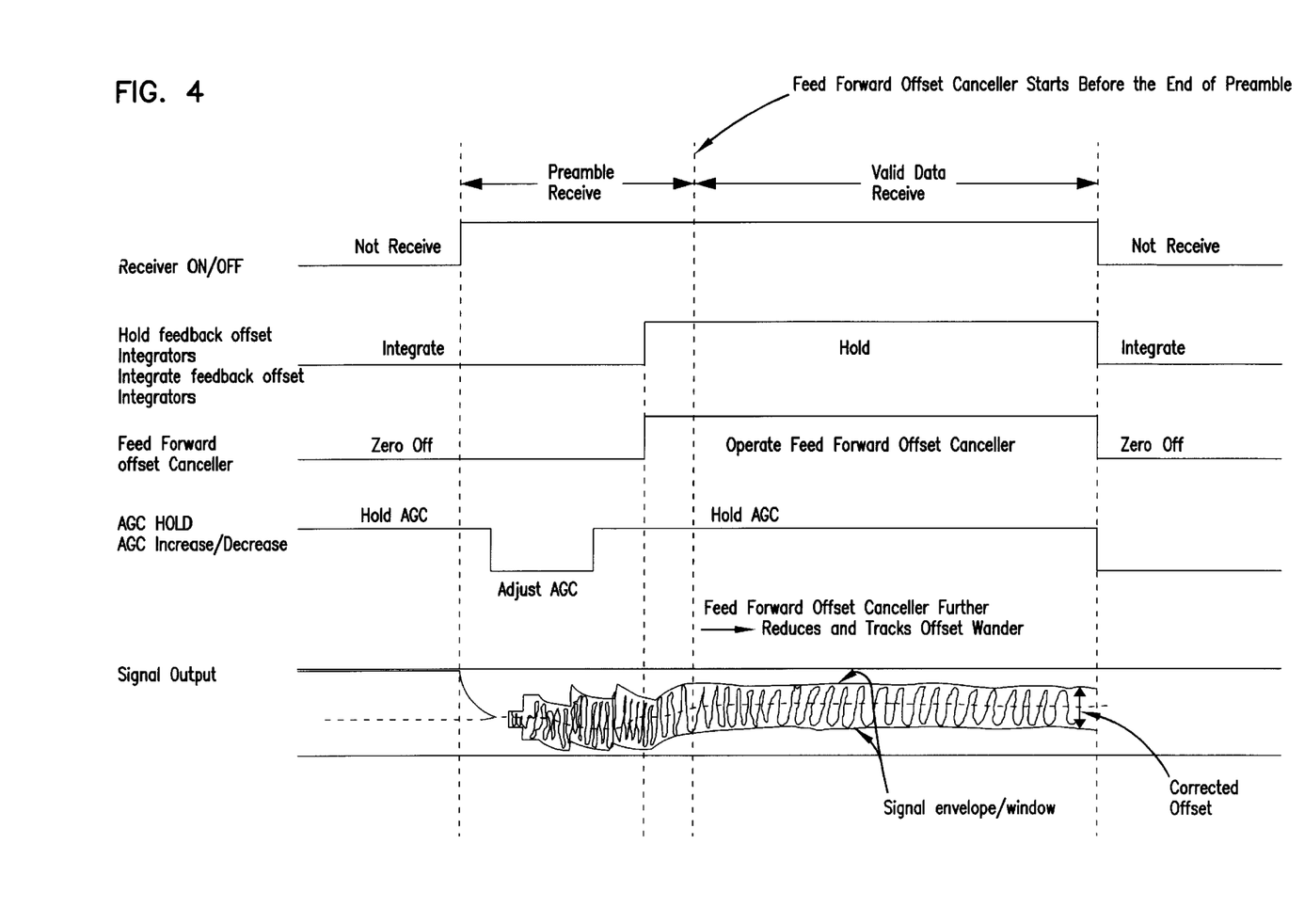
FIG. 4 illustrates a signal diagram of one embodiment of the automatic gain control and offset correction system in accordance with the principles of the present invention.

FIG. 4 illustrates a signal diagram of one embodiment of the automatic gain control and offset correction system in accordance with the principles of the present invention. The transceiver starts to receive an incoming signal and after a preamble time period, valid data burst is received. Also, before the start of data burst, i.e. the receiver starts to receive the signal preamble, the feedback offset integrators are enabled to integrate for a portion of the signal preamble.

As shown in FIG. 4, the feed forward offset canceller or cancellation loop is initially held zeroed, no cancellation, and is enabled when the feedback offset integrators are in the hold mode. It is also noted that the feed forward offset canceller is enabled before the end of the preamble period. The feed forward offset canceller further reduces and tracks the DC offset wander.

The automatic gain control loop is in a hold mode initially. During the preamble time period of an incoming signal, the gain is adjusted such that the gain is placed in the proper signal level envelop or gain control window. Once the gain is adjusted, the automatic gain control is shifted back to a hold mode.

As shown in FIG. 4, a signal output is properly captured, after the preamble time period, with a controlled gain and corrected offset. The signal is then sent to a subsequent circuit, such as the demodulator for data recovery.

Figure 5:
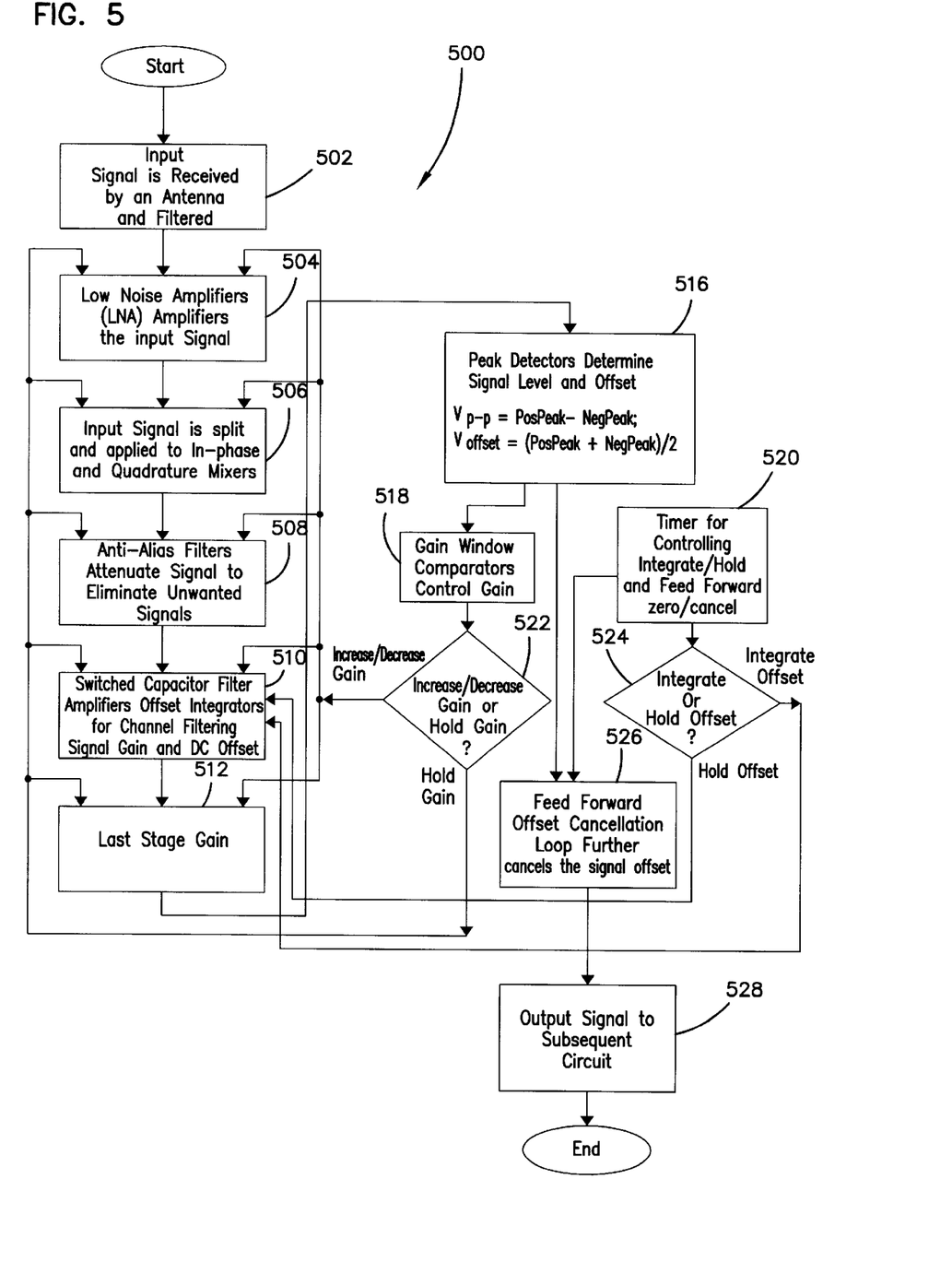
FIG. 5 illustrates a flow chart of an operation of one embodiment of the automatic gain control and offset correction system in accordance with the principles of the present invention.

FIG. 5 illustrates a flow chart of an operation 500 of one embodiment of the automatic gain control and offset correction system in accordance with the principles of the present invention. In an operation 502, an incoming signal is received at an antenna and is preferably matched to a resistance of 50 ohms. The received signal is then passed to a low noise amplifier (LNA) to amplify the signal in an operation 504. The signal is then split into two identical versions and applied to the in-phase and quadrature receive mixers in an operation 506. The result of the in-phase and quadrature mixer is an inphase baseband signal and a quadrature baseband signal. The in-phase and quadrature baseband signals make it possible to represent a complex RF signal.

Then, in an operation 508, anti-alias filters are used to attenuate the signals and frequencies to eliminate unwanted signals which would otherwise pass directly through the subsequent time sampled, adjustable gain, switch capacitor filters/amplifiers. The adjustable gain switched capacitor filters/amplifiers receive the signal and provide channel filtering and signal gain in an operation 510. Also, in the operation 510, the feedback offset integrators cancel a DC offset. In an operation 512, the last stage gain amplifier provides additional signal gain.

The peak detectors calculate a signal level (peak to peak) and an offset in an operation 516. The calculated signal level is subsequently used by the automatic gain controller amplitude window comparators in an operation 518 to control the gain. The calculated offset is subsequently used by the feed forward offset canceller to further reduce the unwanted DC offset.

In an operation 522, the automatic gain controller determines whether the amplifiers should adjust the gain, i.e. increase/decrease the gain, or hold the gain. If the automatic gain controller determines to adjust the gain, a control signal to adjust the gain is sent to the LNAs, the mixers, the anti-alias filters, the switched capacitor filters/amplifiers, and the last stage gain amplifier for the operations 504, 506, 508, 510, and 512, respectively. On the other hand, if the automatic gain controller determines to hold the gain, a control signal to hold the gain is sent to the LNAs, the mixers, the anti-alias filters, the switched capacitor filters/amplifiers, and the last stage gain amplifier for the operations 504, 506, 508, 510, and 512, respectively.

In an operation 520, the offset controller, such as a timer, controls the offset integrators. The offset controller determines whether the offset integrators should integrate the offset or hold the integration in an operation 524. If the offset controller determines to integrate the offset, a control signal to integrate the offset is sent to the operation 510 to cancel the DC offset. On the other hand, if the offset controller determines to hold the offset, a control signal to hold the offset is sent to the operation 510 to cancel the DC offset with the held offset.

In an operation 526, the feed forward offset cancellation loop further cancels the DC offset. Then, in an operation 528, the signal is outputted to the subsequent circuit, such as the demodulation, for data recovery. The operation may be terminated or continued for another data burst.

Figure 6:
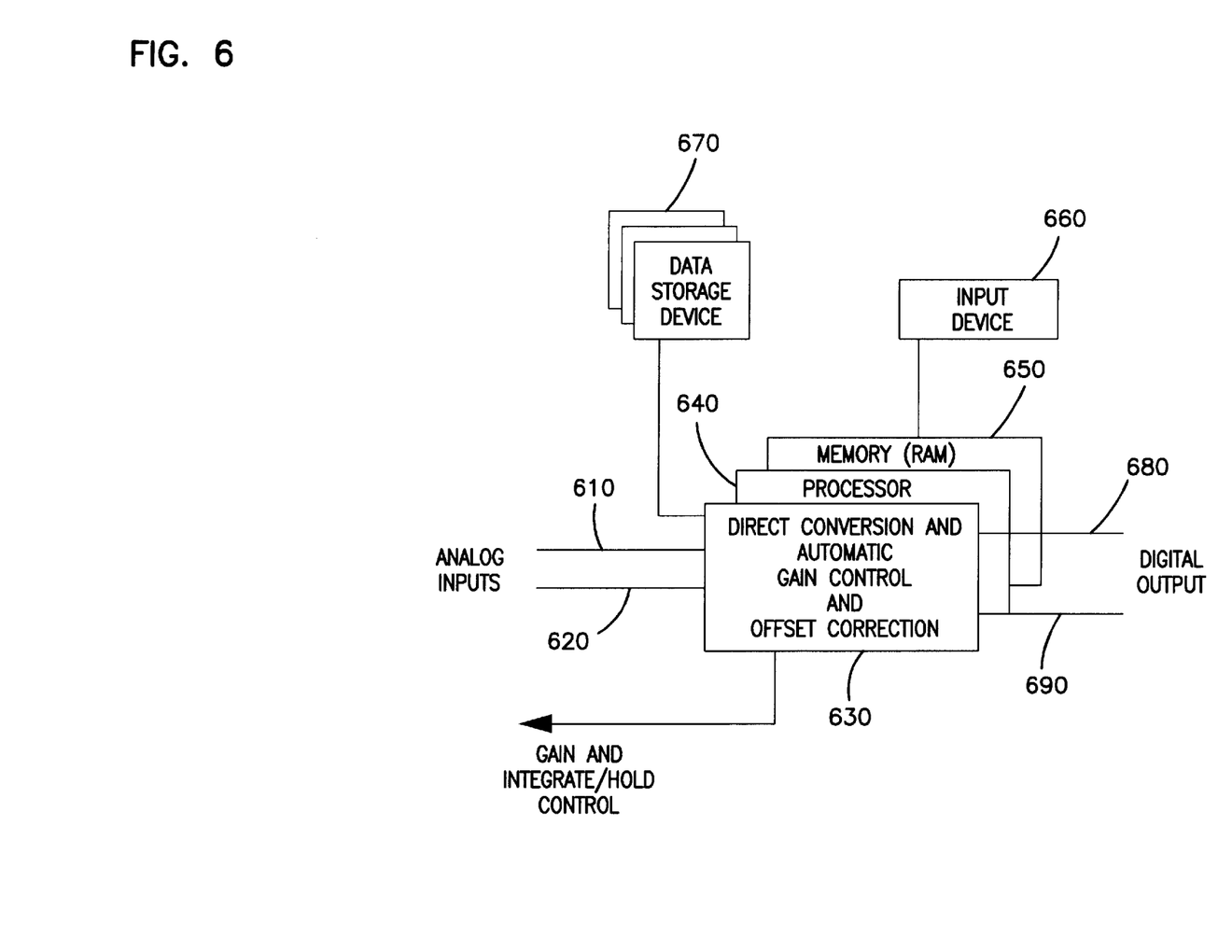
FIG. 6 illustrates a block diagram of a hardware environment implementing one embodiment of the automatic gain control and offset correction system in accordance with the principles of the present invention.

FIG. 6 illustrates a block diagram of a hardware environment which can be used to implement one embodiment of the automatic gain control and offset correction system in accordance with the principles of the present invention. The present invention may be implemented by using an automatic gain control and offset correction system 630, comprised of a processor 640 and memory (RAM) 650. It is envisioned that attached to the automatic gain control and offset correction system 630 may be a memory device 650. Also included in this embodiment may be input devices 660, for downloading data and commands. An A/D converter may be used to convert the baseband signal from an analog format to a digital format and all operations may be performed by the processor. The processor may be a general purpose DSP or specifically designed custom type of processor.

The automatic gain control and offset correction system 630 may operate under the control of an operating system. The automatic gain control and offset correction system 630 may execute one or more computer programs under the control of the operating system.

Generally, the operating system and the detector programs may be tangibly embodied in a computer-readable medium or carrier, e.g. one or more of the fixed or removable data storage devices 670, or other data storage or data communications devices. Both operating system and the computer programs may be loaded from the data storage devices into the memory 650 of the automatic gain control and offset correction system 630 for execution by the processor 640. Those skilled in the art will recognize that the memory 650 is optional, or may be a memory device embedded or otherwise couple to the automatic gain control and offset correction circuit 630. Both the operating system and the detector programs comprise instructions which, when read and executed by the processor 640, cause the detector to perform the steps necessary to execute the steps or elements of the present invention.

Although one detector system configuration is illustrated in FIG. 6, those skilled in the art will recognize that any number of different configurations performing similar functions may be used in accordance with the present invention.

The foregoing description of the exemplary embodiment of the invention has been presented for the purposes of illustration and description. It is not intended to be exhaustive or to limit the invention to the precise form disclosed. Many modifications and variations are possible in light of the above teaching.

What is claimed is:

1. A method of incorporating an offset correction and automatic gain control system into a direct conversion type of transceiver in a communication system, comprising:
   receiving an incoming signal having a DC content;
   converting the incoming signal to a baseband signal;
   amplifying the baseband signal; and
   canceling DC offset and controlling gain of the amplified signal within a preamble period, wherein the DC content of an incoming signal envelop is subtracted from an instantaneous incoming signal plus the DC offset thereby resulting in the incoming signal without the DC offset, the instantaneous incoming signal retaining its necessary DC content while undesired offset is cancelled.

2. The method of claim 1, wherein the canceling of the DC offset comprises two phases of operation, the first phase of the operation includes reducing the DC offset by integrating a feedback offset integrator, the offset integrator is controlled such that the offset integrator integrates for a portion of the preamble period, and the second phase of the operation includes canceling any residual offset by a feed forward offset canceller.

3. The method of claim 1, wherein the controlling of the gain comprises either enabling the amplifier to adjust the gain or holding the gain of the amplifier.

4. The method of claim 1, further comprising detecting an envelop of the incoming signal by a peak detector, the peak detector separating a signal induced DC wander from a component induced DC offset thereby allowing for continuous feed forward offset cancellation while not causing additional signal dependant wander.

5. An automatic gain control and offset correction system, comprising:
   an amplifier amplifying a baseband signal which is directly converted from a received incoming signal;
   a feedback offset canceller coupled to the amplifier, the feedback offset canceller controllably canceling DC offset;
   an automatic gain controller coupled to the amplifier, the automatic gain controller controlling gain of the amplifier;
   a feed forward offset canceller; and
   a signal peak detector coupled to the feed forward offset canceller and the automatic gain controller, the automatic gain controller being controlled by the signal peak detector, and the feed forward offset canceller further canceling the DC offset.

6. The system of claim 5, further comprising a low noise amplifier, a mixer, and an anti-alias filter, the incoming signal being amplified and converted to an in-phase signal and a quadrature baseband signal by the low noise amplifier, the mixer, and the anti-alias filter.

7. The system of claim 5, wherein the feedback offset canceller comprises an offset integrator.

8. The system of claim 5, wherein the automatic gain controller comprises a gain control window comparator, the gain control window comparator either enables the amplifier to adjust the gain or holds the gain of the amplifier.

9. A direct conversion transceiver system for incorporating an offset correction and automatic gain control system, comprising:
   an antenna receiving an incoming signal;
   an amplifier amplifying a baseband signal which is directly converted from the received incoming signal;
   a feedback offset canceller coupled to the amplifier, the feedback offset canceller controllably canceling DC offset;
   an automatic gain controller coupled to the amplifier, the automatic gain controller controlling gain of the amplifier;
   a feed forward offset canceller; and
   a signal peak detector coupled to the feed forward offset canceller and the automatic gain controller, the automatic gain controller being controlled by the signal peak detector, and the feed forward offset canceller further canceling the DC offset.

10. The transceiver system of claim 9, further comprising a low noise amplifier, a mixer, and an anti-alias filter, the incoming signal being amplified and converted to an in-phase signal and a quadrature baseband signal by the low noise amplifier, the mixer, and the anti-alias filter.

11. The transceiver system of claim 9, wherein the feedback offset canceller comprises an offset integrator.

12. A computer program storage medium readable by a computing system and encoding a computer program of instructions for executing a computer process for incorporating an offset correction and automatic gain control system into a direct conversion type of transceiver in a communication system, the computer process comprising:
   receiving an incoming signal having a DC content;
   converting the incoming signal to a baseband signal;
   amplifying the baseband signal; and
   canceling DC offset and controlling gain of the amplified signal within a preamble period, wherein the DC content of an incoming signal envelop is subtracted from an instantaneous incoming signal plus the DC offset thereby resulting in the incoming signal without the DC offset, the instantaneous incoming signal retaining its necessary DC content while undesired offset is cancelled.

13. A computer data signal embodied in a carrier wave readable by a computing system and encoding a computer program of instructions for executing a computer process for incorporating an offset correction and automatic gain control system into a direct conversion type of transceiver in a communication system, the computer process comprising:

receiving an incoming signal having a DC content;

converting the incoming signal to a baseband signal;

amplifying the baseband signal; and canceling DC offset and controlling gain of the amplified signal within a preamble period, wherein the DC content of an incoming signal envelop is subtracted from an instantaneous incoming signal plus the DC offset thereby resulting in the incoming signal without the DC offset, the instantaneous incoming signal retaining its necessary DC content while undesired offset is cancelled.

* * * * *

UNITED STATES PATENT AND TRADEMARK OFFICE
CERTIFICATE OF CORRECTION

PATENT NO. : 6,516,185 B1
DATED : February 4, 2003
INVENTOR(S) : MacNally

It is certified that error appears in the above-identified patent and that said Letters Patent is hereby corrected as shown below:

<u>Title page,</u>
Item [56], References Cited, U.S. PATENT DOCUMENTS, insert
-- 3,562,504   2/1971       Harris
5,276,685      1/1994       Kepler et al.
5,301,364      4/1994       Arens et al.
5,680,075      10/1997      Sacca --

Signed and Sealed this

Nineteenth Day of August, 2003

JAMES E. ROGAN
*Director of the United States Patent and Trademark Office*